US 6,723,917 B1

(12) United States Patent
Wang

(10) Patent No.: US 6,723,917 B1
(45) Date of Patent: Apr. 20, 2004

(54) PROTECTIVE SHIELD FOR AGAINST DAMAGING CIRCUIT BOARD AND FOR SAFEGUARDING CHIP

(75) Inventor: Jui-Tung Wang, Taipei Hsien (TW)

(73) Assignee: Gainward Co., Ltd., Taipei Hsien ( * ) Notice: Subject to any disclaimer, the term of this patent is extended or adjusted under 35 U.S.C. 154(b) by 0 days.

(21) Appl. No.: 10/435,544

(22) Filed: May 12, 2003

(51) Int. Cl.⁷ .................................................. H05K 9/00

(52) U.S. Cl. .............................. 174/35 GC; 174/35 R; 361/816; 361/704; 361/720

(58) Field of Search .......................... 174/35 R, 35 MS, 174/35 GC; 361/816, 704, 720

(56) References Cited

U.S. PATENT DOCUMENTS

| 5,175,613 | A | * | 12/1992 | Barker, III et al. | ......... 257/713 |
| 5,541,811 | A | * | 7/1996 | Henningsson et al. | ...... 361/704 |
| 6,084,178 | A | * | 7/2000 | Cromwell | ................. 174/35 R |

* cited by examiner

Primary Examiner—Hung V. Ngo

(57) ABSTRACT

A protective metal shield for against damaging a circuit board and for safeguarding a chip includes a fixed metal shield above a chip on a circuit board. The metal shield has five sealed planes and an opening facing downward, and an underside of a top portion thereof being in contact with a top surface of the chip. Above the metal shield is additionally provided with cooling fins. Using the aforesaid structure, the metal shield is covered above the chip, thereby protecting the chip from man-made scratches and damages.

5 Claims, 4 Drawing Sheets

PROTECTIVE SHIELD FOR AGAINST DAMAGING CIRCUIT BOARD AND FOR SAFEGUARDING CHIP

BACKGROUND OF THE INVENTION (a) Field of the Invention

The invention relates to a protective shield for against damaging a circuit board and for safeguarding a chip, and more particularly, to a metal shield covered on top of a chip, so as to avoid scratching and damages caused during dismantling and assembly of a cooling device disposed above the chip, and to conduct and distribute heat energy produced by the chip to cooling fins and a fan provided above, thereby protecting scratching, and damages of the chip.

(b) Description of the Prior Art

Common advanced circuit boards with faster algorithmic rates generally need to be equipped with more advanced (faster algorithmic rates) chips. Especially for video graphic array (VGA) cards and high-end computer motherboards requiring better color display capabilities for three-dimensional animated pictures, chipsets having top qualities are needed therein. However, this type of chip having excellent high resolution and algorithmic rates is rather expensive, wherein heat is often incurred during processing thereof. Therefore, it is necessary to dispose cooling fins, a fan, and a clamping apparatus for clamping the cooling fins above the chip, wherein the fans and clamping apparatus for clamping cooling fins are considered as expendables. For more costly circuits boards, used expendable components are replaced by new ones during periodical, maintenances. However, during dismantling or assembly of the cooling fins, because of restricted working space or carelessness, the clamping apparatus made of metals or edges and corners of the cooling fins are likely to scratch surfaces of the chip, and the chip may be resulted with permanent damages. Hence, expensive circuit boards frequently become invalid or seriously damaged. In the view of the challenging difficulties during dismantling and assembly of various expendable components in costly circuit boards having restricted working space, and resulting shortcomings of scratching and damaging by sharp metal objects as in the aforesaid description, it is important as how to make appropriate advancements for overcoming these disadvantages.

SUMMARY OF THE INVENTION

Therefore, to overcome the aforesaid disadvantages, the primary object of the invention is to provide a metal shield above a chip on a circuit board for covering an entire structure of the chip. The metal shield has five sealed planes and an opening facing downward and an underside of a top portion thereof being in contact with a top surface of the chip, so as to conduct and distribute heat energy produced by the chip. Above the metal shield is additionally provided with cooling fins and a fan. Using the aforesaid structure, the metal shield is protected against scratches or damages caused by sharp corners of metal objects, thereby reducing man-made impairs as well as lengthening a lifespan of the chip

DETAILED DESCRIPTION OF THE PREFERRED EMBODIMENTS

To better understand the contents of the invention, descriptions shall be given with the accompanying drawings hereunder.

Figure 1:
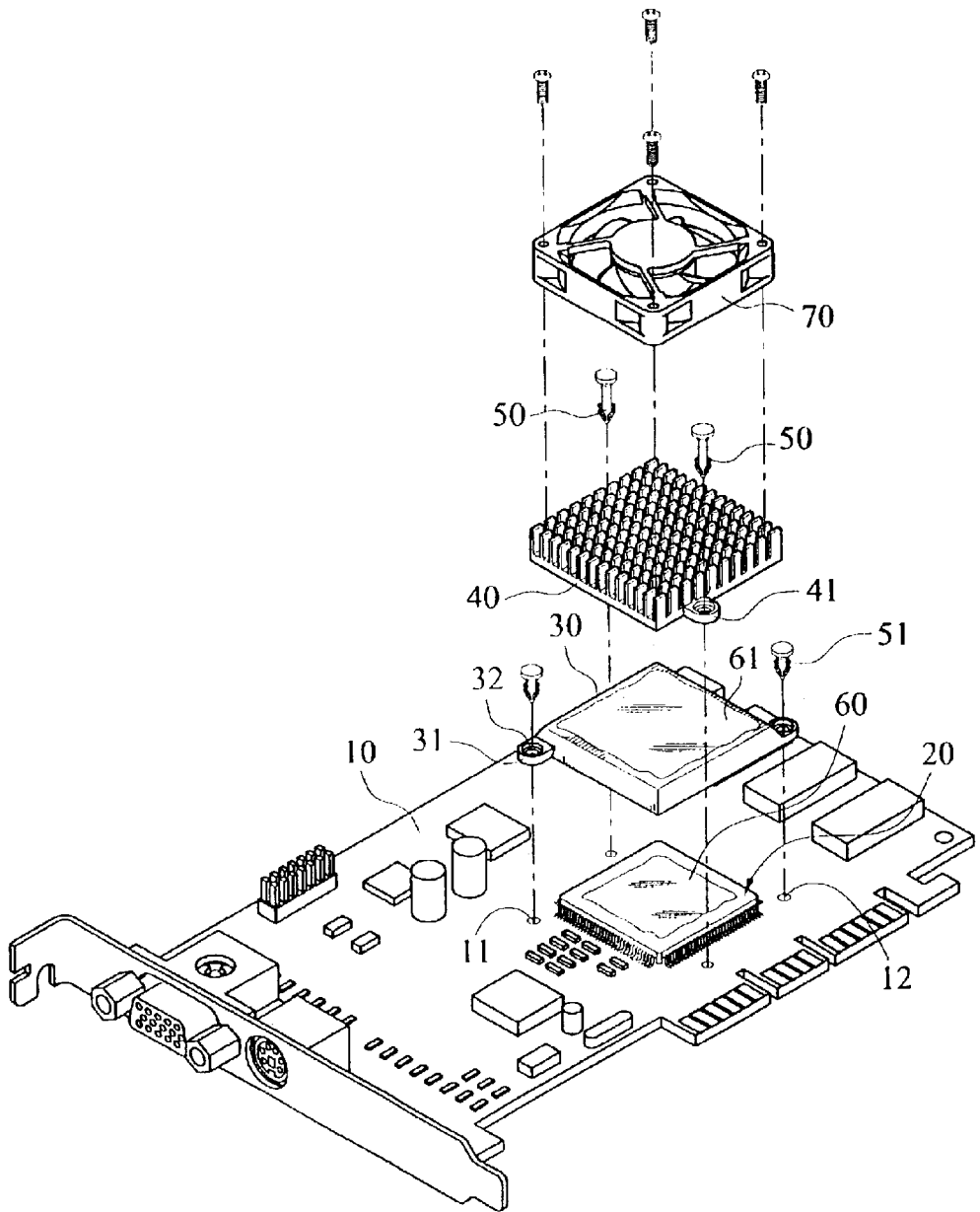
FIG. 1 shows an exploded structural view according to the invention.
Figure 3A:
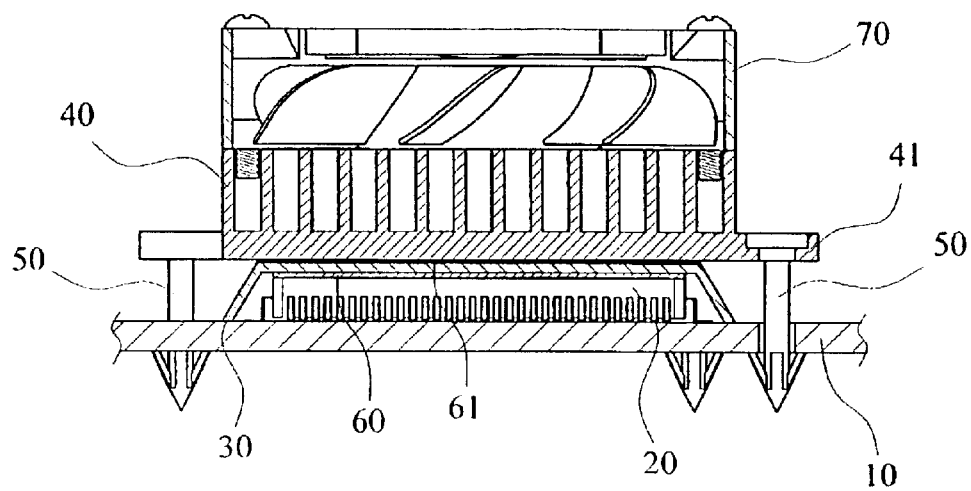
FIG. 3A shows a longitudinal sectional view according to the invention.

Referring to FIGS. 1 and 3A, the invention comprises:

at least two paired insertion openings 11 and 12 disposed next to a specific advanced algorithmic chip 20 (for example, a VGA chip in a VGA card, or a central processing unit in a motherboard) located on a circuit board 10; and a metal shield 30 having five sealed planes, an opening facing downward, and flanges 31 provided with fastening apertures 32 at least two corresponding bottom portions of side walls at a periphery thereof; wherein the side walls of the periphery of the metal shield 30 are slightly expanded in an outward direction, and the outwardly expanded angle is preferably about 30° to the vertical.

Figure 2:
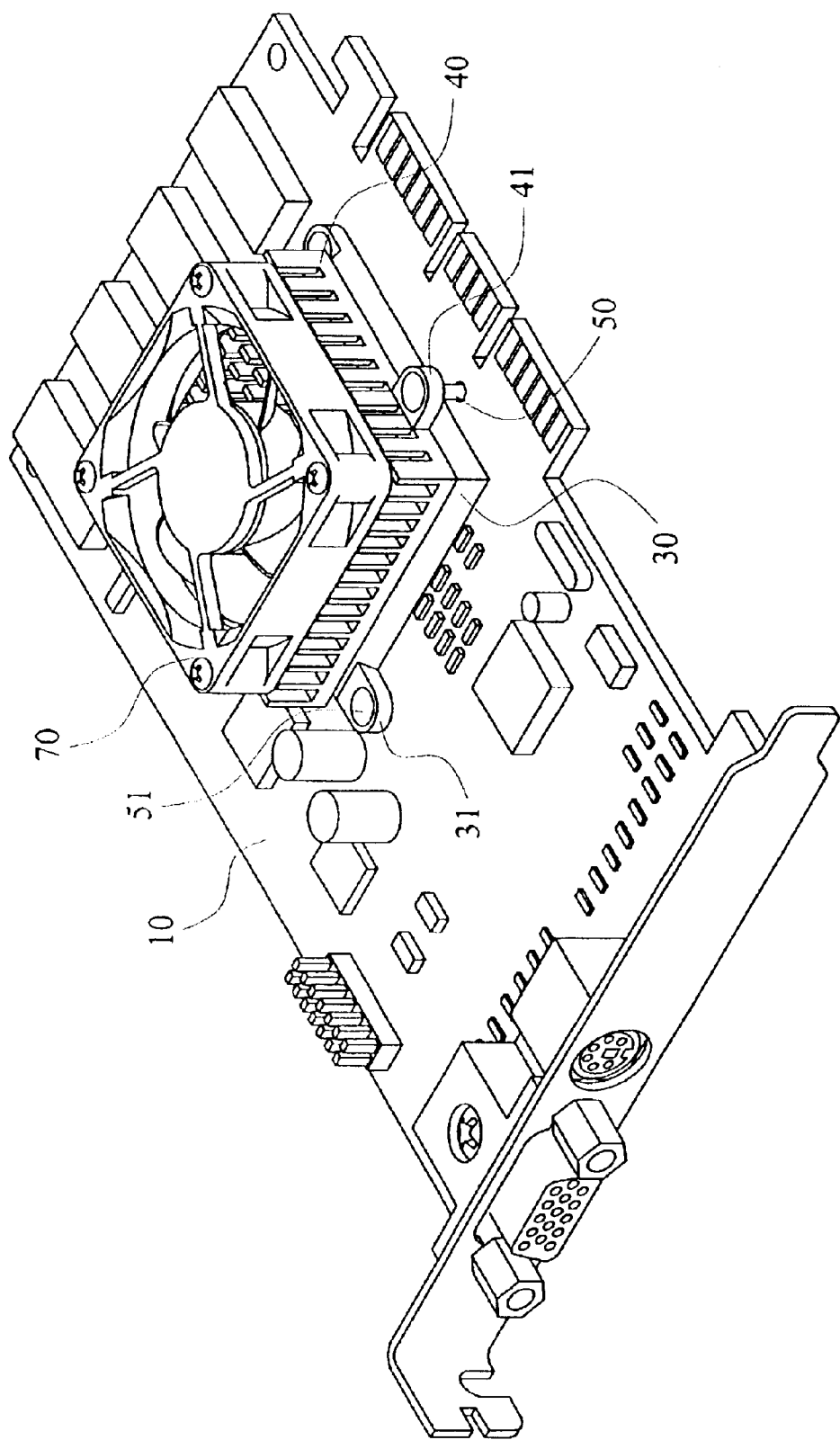
FIG. 2 shows an embodiment of according to the invention being assembled.

Referring to FIGS. 1, 2 and 3A, the metal shield 30 covers an entire body of the chip 20, and an underside of a top portion of the chip 20 is in contact with a top plane of the chip 20. In addition, a contact plane between the metal shield 30 and the chip 20 is provided with a layer of heat conducting paste 60, so as to distribute heat energy produced by the chip 20 evenly over the metal shield 30 for heat dissipation. Above the metal shield 30 may be additionally disposed with cooling fins 40 and a fan 70 for better heat dissipation effects. Also, by mounting of the cooling fins 40 to the circuit board 10, the metal shield is clamped and fastened in between. Furthermore, a layer of heat conducting paste 61 is also applied between the metal shield 30 and the cooling fins 40.

In an embodiment according to the invention, the cooling fins 40 and the circuit board 10 are fastened using the following method. Two corresponding sides of the cooling fins 40 are disposed with a fastening piece 41, respectively, two fastening nails 50 are penetrated through the fastening pieces 41 and nailed into the insertion openings 12 of the circuit board 10, and the metal shield 30 is then simultaneously clamped and fixed. Above the cooling fins 40 may also be provided with a fan 70 for better heat dissipation effects.

Figure 3B:
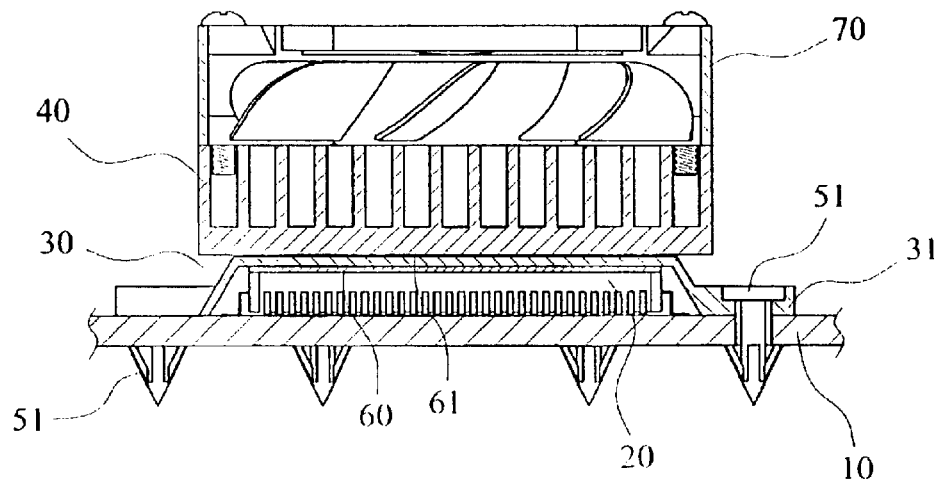
FIG. 3B shows another longitudinal sectional view according to the invention.
Figure 4:
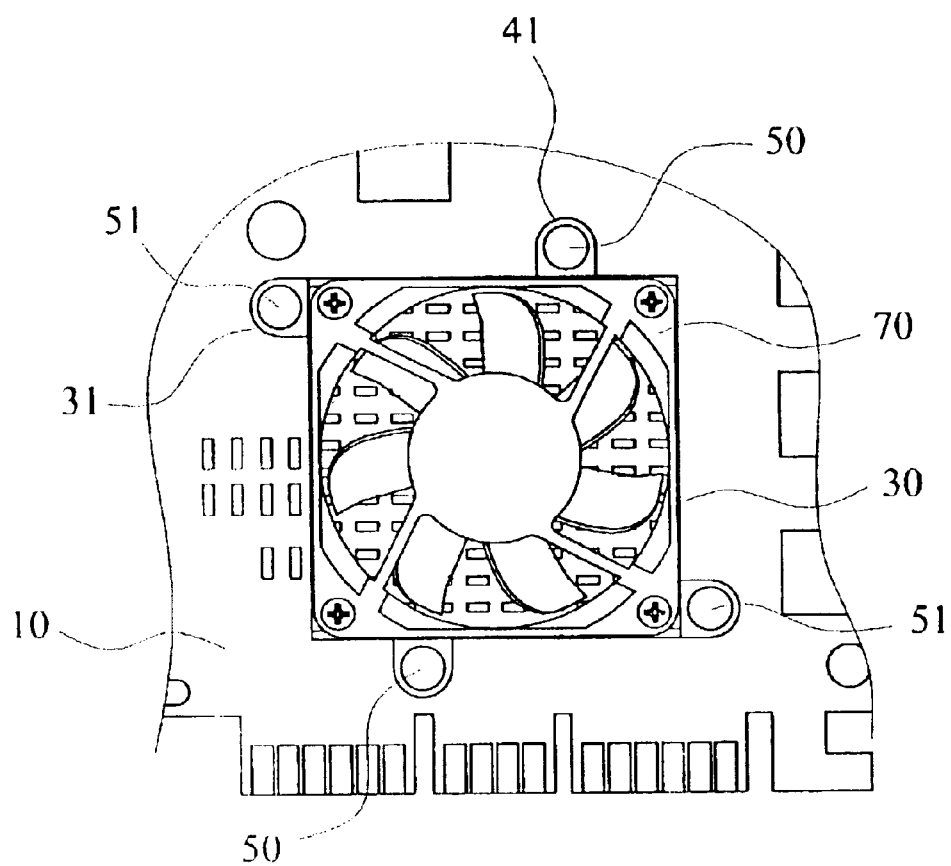
FIG. 4 shows a top view illustrating an embodiment according to the invention after having been assembled.

Referring to FIGS. 1, 2 and 3B, the metal shield 30 is independently fastened onto the circuit board 10. The flanges 31 having the fastening apertures 32 are corresponded with the other insertion openings 11 and penetrated through using two fastening nails 51, and the metal shield 30 is then directly fixed onto the circuit board 10. Referring to FIGS. 2 and 4, when the metal shield 30 and the cooling fins 40 are individually fixed on the circuit board 10, the flanges 31 of the metal shield 30 and the fastening pieces 41 of the cooling fins 40 are staggered, and thus making fixing thereof easier.

The invention has the advantages below when put to use:

1. According to the invention, a chip is covered and provided with a metal shield above, and the metal body is in contact with a top portion of the chip. Not only the chip is protected from external scratches and damages but also a lifespan of the chip is prolonged.

2. For that side walls at a periphery of the metal shield are slightly expanded outward, better stability is obtained when covering onto a chip, land a top portion of the chip is even more plainly adhered to the chip.

3. Contact planes of the metal shield with the chip and the cooling fins are provided with heat conducting paste, and therefore heat energy from the chip is rapidly and evenly distributed and absorbed by the cooling fin disposed above.

The structure according to the invention has the advantages of protecting a chip from scratching and damaging, reducing man-made impairs, and lengthening a lifespan of the chip. It is of course to be understood that the embodiment described herein is merely illustrative of the principles of the invention and that a wide variety of modifications thereto may be effected by persons skilled in the art without departing front the spirit an d scope of the invention as set forth in the following claims.

What is claimed is:

1. A protective metal shield for against damaging a circuit board and for safeguarding a chip comprising a metal shield having five sealed planes and an opening facing downward, and an underside of a top portion thereof being in contact with a top surface of the chip; wherein, above the metal shield is additionally provided with cooling fins, and the metal shield is clamped and fastened by mounting the cooling fins onto the circuit board; a periphery of the chip is disposed with a plurality of insertion openings, and bottom portions of at least two corresponding side walls of a periphery of the metal shield are provided with flanges having fastening apertures, thereby directly fastening the metal shield onto the circuit board by penetrating two fastening nails through the flanges.

2. The protective metal shield for against damaging a circuit board and for safeguarding a chip in accordance with claim 1, wherein side walls of the periphery of the metal shield are slightly expanded outward.

3. The protective metal shield for against damaging a circuit board and for safeguarding a chip in accordance with claim 1, wherein the outwardly expanded angle of the side walls of the periphery of the metal shield is preferably about 30° to the vertical.

4. The protective metal shield for against damaging a circuit board and for safeguarding a chip in accordance with claim 1, wherein a contact plane between the metal shield and the chip is provided with heat conducting paste.

5. The protective metal shield for against damaging a circuit board and for safeguarding a chip in accordance with claim 1, wherein a contact plane between the metal shield and the cooling fins above is provided with heat conducting paste.

\* \* \* \* \*